United States Patent
Lee

(10) Patent No.: US 9,147,716 B2
(45) Date of Patent: Sep. 29, 2015

(54) PIXEL STRUCTURE, DISPLAY PANEL AND FABRICATION METHOD THEREOF

(71) Applicant: AU Optronics Corp., Hsin-Chu (TW)

(72) Inventor: Seok-Lyul Lee, Hsin-Chu (TW)

(73) Assignee: AU Optronics Corp., Science-Based Industrial Park, Hsin-Chu (TW)

(*) Notice: Subject to any disclaimer, the term of this patent is extended or adjusted under 35 U.S.C. 154(b) by 25 days.

(21) Appl. No.: 14/178,282

(22) Filed: Feb. 12, 2014

(65) Prior Publication Data

US 2015/0028364 A1 Jan. 29, 2015

(30) Foreign Application Priority Data

Jul. 25, 2013 (TW) .............................. 102126650 A

(51) Int. Cl.
| | | |
|---|---|---|
| H01L 29/18 | (2006.01) | |
| H01L 27/32 | (2006.01) | |
| H01L 29/786 | (2006.01) | |
| H01L 33/08 | (2010.01) | |

(52) U.S. Cl.
CPC ........ *H01L 27/3248* (2013.01); *H01L 29/7869* (2013.01); *H01L 33/08* (2013.01)

(58) Field of Classification Search
None
See application file for complete search history.

(56) References Cited

U.S. PATENT DOCUMENTS

| | | |
|---|---|---|
| 5,206,749 A | 4/1993 | Zavracky |
| 6,111,627 A | 8/2000 | Kim |
| 2005/0078261 A1* | 4/2005 | Ono et al. ..................... 349/141 |
| 2008/0035920 A1 | 2/2008 | Takechi |
| 2009/0279028 A1* | 11/2009 | Chen et al. ..................... 349/114 |
| 2010/0002179 A1 | 1/2010 | Horiguchi |
| 2011/0073867 A1* | 3/2011 | Xie et al. ........................ 257/72 |
| 2011/0299022 A1* | 12/2011 | Li et al. ......................... 349/143 |
| 2012/0175607 A1 | 7/2012 | Shu |

FOREIGN PATENT DOCUMENTS

KR 1020130034548 A 4/2013

* cited by examiner

*Primary Examiner* — Benjamin Sandvik
*Assistant Examiner* — Herve Assouman
(74) *Attorney, Agent, or Firm* — Winston Hsu; Scott Margo

(57) ABSTRACT

A pixel structure includes an active switching device, a patterned common electrode layer, an insulation layer, a patterned oxide electrode layer and a patterned passivation layer. The insulation layer covers the patterned common electrode layer. The patterned oxide electrode layer is disposed on the insulation layer and electrically connected to the active switching device. The patterned oxide electrode layer includes a semiconductor part and a conductive part. The semiconductor part and the patterned common electrode layer substantially overlap to each other in a vertical projection direction. The conductive part and the semiconductor part are connected to each other, the conductive part and the patterned common electrode layer do not overlap to each other in the vertical projective direction, and the conductive part is a pixel electrode. The patterned passivation layer covers the semiconductor part, and the patterned passivation layer has an opening exposing the conductive part.

20 Claims, 15 Drawing Sheets

PIXEL STRUCTURE, DISPLAY PANEL AND FABRICATION METHOD THEREOF

BACKGROUND OF THE INVENTION

1. Field of the Invention

The present invention relates to a pixel structure, a display panel and fabrication thereof, and more particularly, to a pixel structure and a display panel having a patterned oxide electrode layer with a semiconductor part and a conductive part and fabrication method thereof.

2. Description of the Prior Art

Liquid crystal display (LCD) panel has been widely used in various types of display devices due to its advantages such as compact size, superior display quality and low power consumption. The conventional LCD panel such as twisted nematic (TN) type LCD panel, however, suffers from the disadvantage of narrow viewing angle, and thus its application is restricted.

To address the narrow viewing angle of TN LCD panel, several wild viewing angle LCD panel e.g. in-plane switching (IPS) LCD panel and fringe field switching (FFS) LCD panel have been proposed. The conventional IPS LCD panel has wider viewing angle, but the region corresponding to the pixel electrode and the common electrode is not light permissible. Therefore, light transmittance and aperture ratio are reduced. The conventional FFS LCD panel has higher light transmittance compared with the IPS LCD panel, but requires two layers of patterned conductive layers including the patterned pixel electrode and the patterned common electrode. Thus, the fabrication cost and the process complexity are both increased. In addition, rubbing mura tends to occur to the alignment film disposed on the patterned pixel electrode, which causes uneven brightness problem.

SUMMARY OF THE INVENTION

It is therefore one of the objectives of the present invention to provide a pixel structure, a display panel and a fabrication method thereof to reduce process steps and fabrication cost and to increase brightness uniformity of displayed image.

In accordance with an embodiment of the present invention, a pixel structure disposed on a first substrate is provided. The pixel structure includes an active switching device, a patterned common electrode layer, an insulation layer, a patterned oxide electrode layer and a patterned passivation layer. The active switching device is disposed on the first substrate. The patterned common electrode layer is disposed on the first substrate. The insulation layer is disposed on the first substrate and covers the patterned common electrode layer. The patterned oxide electrode layer is disposed on the insulation layer and electrically connected to the active switching device. The patterned oxide electrode layer includes a semiconductor part and a conductive part. The semiconductor part substantially overlaps the patterned common electrode layer in a vertical projection direction; the conductive part is connected to the semiconductor part and substantially does not overlap the patterned common electrode layer in the vertical projection direction, and the conductive part is a pixel electrode. The patterned passivation layer is disposed on the patterned oxide electrode layer and covers the semiconductor part of the patterned oxide electrode layer. The patterned passivation layer has an opening exposing the conductive part of the patterned oxide electrode layer.

In accordance with another embodiment of the present invention, a display panel is provided. The display panel includes a first substrate, an active switching device, a patterned common electrode layer, an insulation layer, a patterned oxide electrode layer, a patterned passivation layer, a second substrate and a display medium. The active switching device is disposed on the first substrate. The patterned common electrode layer is disposed on the first substrate. The insulation layer is disposed on the first substrate and covers the patterned common electrode layer. The patterned oxide electrode layer is disposed on the insulation layer and electrically connected to the active switching device. The patterned oxide electrode layer includes a semiconductor part and a conductive part. The semiconductor part substantially overlaps the patterned common electrode layer in a vertical projection direction; the conductive part is connected to the semiconductor part and substantially does not overlap the patterned common electrode layer in the vertical projection direction, and the conductive part is a pixel electrode. The patterned passivation layer is disposed on the patterned oxide electrode layer and covers the semiconductor part of the patterned oxide electrode layer. The patterned passivation layer has an opening exposing the conductive part of the patterned oxide electrode layer. The second substrate faces the first substrate. The display medium is interposed between the first substrate and the second substrate.

In accordance with still another embodiment of the present invention, a method of fabricating pixel structure is provided. The method includes the following steps. A first substrate is provided. A patterned common electrode layer is formed on the first substrate. An insulation layer is formed on the first substrate. The insulation layer covers the patterned common electrode layer. A patterned oxide electrode layer and a patterned passivation layer are formed on the insulation layer. The patterned oxide electrode layer includes a semiconductor part substantially overlapping the patterned common electrode layer in a vertical projection direction and a conductive part connected to the semiconductor part and substantially not overlapping the patterned common electrode layer in the vertical projection direction, the conductive part is a pixel electrode, the patterned passivation layer covers the semiconductor part of the patterned oxide electrode layer and the patterned passivation layer has an opening exposing the conductive part of the patterned oxide electrode layer. An active switching device is formed on the first substrate, and the patterned oxide electrode layer is electrically connected to the active switching device.

The pixel structure and display panel of the present invention use the conductive part of the patterned oxide electrode layer as pixel electrode, which can effectively increase the transmittance and brightness uniformity of the displayed images.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
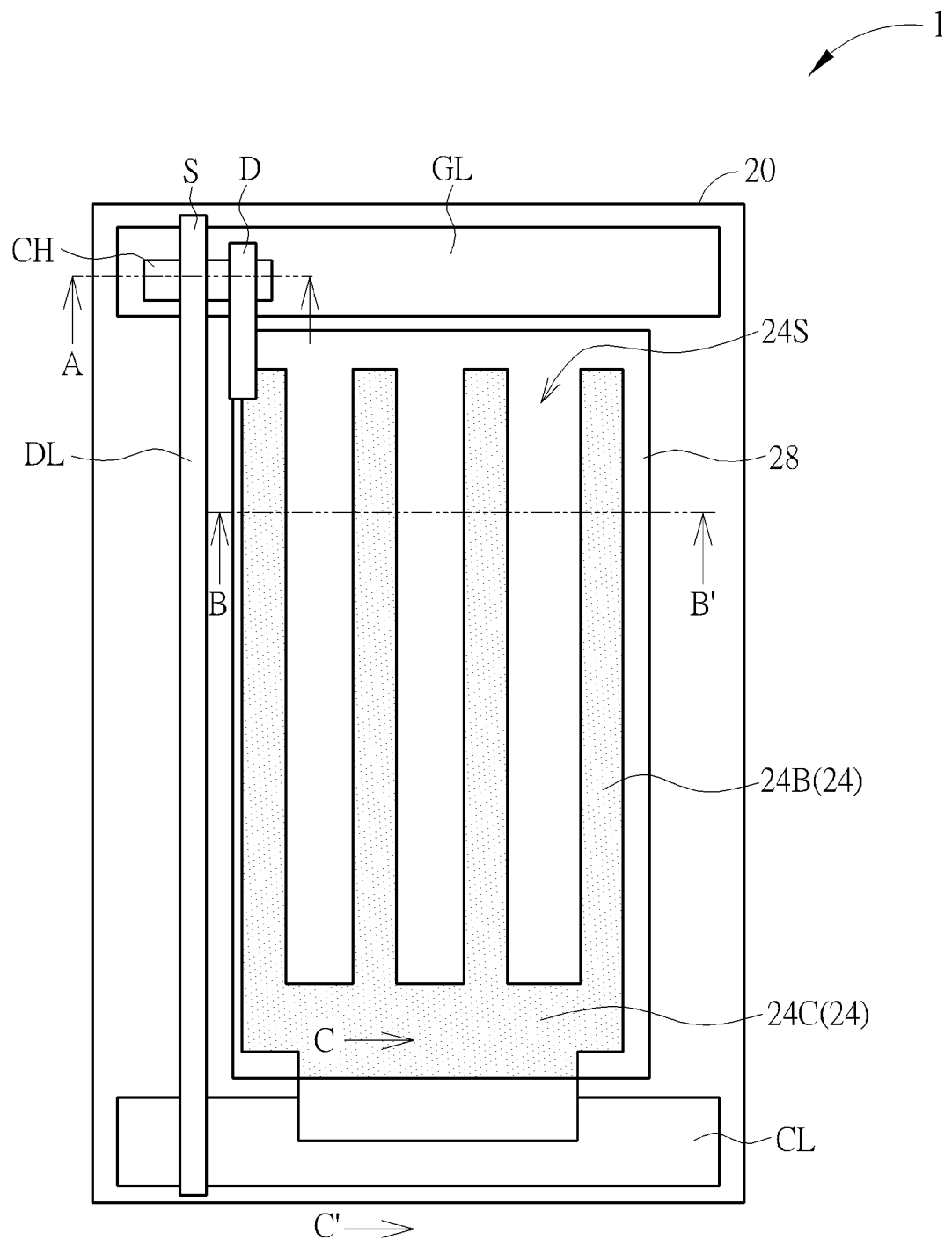
FIG. 1 is a top view of a pixel structure according to an embodiment of the present invention.
Figure 2:
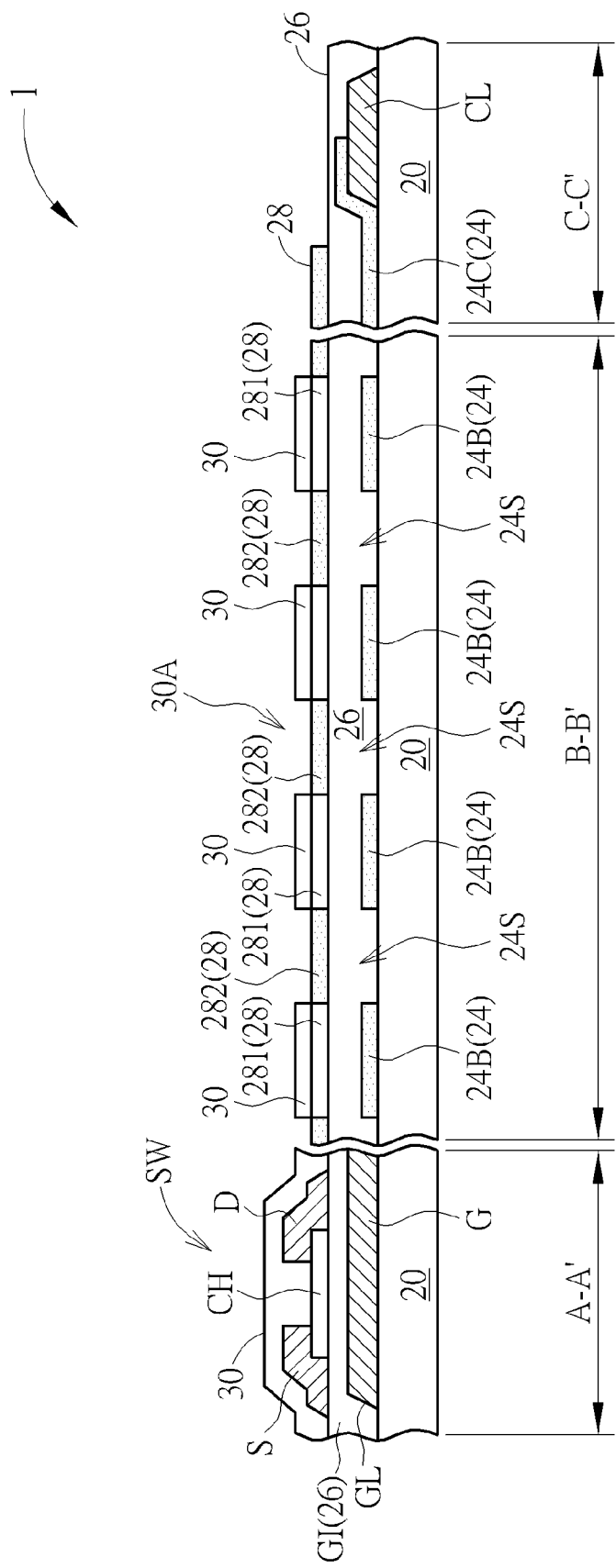
FIG. 2 is a cross-sectional view of the pixel structure taken along line A-A', line B-B' and line C-C' of FIG. 1.

Referring to FIG. 1 and FIG. 2, FIG. 1 is a top view of a pixel structure according to an embodiment of the present invention, and FIG. 2 is a cross-sectional view of the pixel structure taken along line A-A', line B-B' and line C-C' of FIG. 1. As shown in FIG. 1 and FIG. 2, the pixel structure 1 of this embodiment is disposed on a first substrate 20. The first substrate 20 may be a transparent substrate, which may be either rigid substrate or flexible substrate. For example, the first substrate 20 may be a glass substrate, a plastic substrate or a quartz substrate, but not limited thereto. The pixel structure 1 includes an active switching device SW, a patterned common electrode layer 24, an insulation layer 26 (not shown in FIG. 1), a patterned oxide electrode layer 28 and a patterned passivation layer 30 (not shown in FIG. 1). The active switching device SW is disposed on the first substrate 20. The patterned common electrode layer 24 is disposed on the first substrate 20, and serves as a common electrode of the pixel structure 1. The material of the patterned common electrode layer 24 may include transparent conductive material such as indium tin oxide (ITO), indium zinc oxide (IZO) or other transparent conductive material or non-transparent conductive material. The patterned common electrode layer 24 may be single-layered or multi-layered structure. The insulation layer 26 is disposed on the first substrate 20, and covers the patterned common electrode layer 24. Specifically, the insulation layer 26 is interposed between the patterned common electrode layer 24 and the patterned oxide electrode layer 28, such that the patterned common electrode layer 24 and the patterned oxide electrode layer 28 are not directly electrically connected to each other. The material of the insulation layer 26 may include inorganic insulation material and/or organic insulation material, for example, silicon oxide, silicon nitride, silicon oxynitride or other proper insulation material. The insulation layer 26 may be single-layered or multi-layered structure. The patterned oxide electrode layer 28 is disposed on the insulation layer 26 and electrically connected to the active switching device SW. The material of the patterned oxide electrode layer 28 may be metal oxide including, for instance, at least one of indium gallium zinc oxide (IGZO), indium tin zinc oxide (ITZO), indium zinc oxide (IZO), zinc tin oxide (ZTO), zinc oxide (ZnO) and aluminum zinc oxide (AZO), but not limited thereto. The material of the patterned oxide electrode layer 28 may be selected from other suitable oxide material. The patterned oxide electrode layer 28 includes a semiconductor part 281 and a conductive part 282. The semiconductor part 281 substantially overlaps the patterned common electrode layer 24 in a vertical projection direction. The conductive part 282 is connected to the semiconductor part 281, and the conductive part 282 substantially does not overlap the patterned common electrode layer 24 in the vertical projection direction. The conductive part 282 is a pixel electrode. The patterned passivation layer 30 covers the semiconductor part 281 of the patterned oxide electrode layer 28, and the patterned passivation layer 30 has an opening 30A exposing the conductive part 282 of the patterned oxide electrode layer 28. The semiconductor part 281 and the conductive part 282 are both part of the patterned oxide electrode layer 28, i.e. the semiconductor part 281 and the conductive part 282 are made of the same material layer. In this embodiment, the semiconductor part 281 has a first resistance, the conductive part 282 has a second resistance and the first resistance is higher than the second resistance. The characteristic of conductor material, semiconductor material and non-conductor material is well known in the art, and thus is not redundantly described.

The pixel structure 1 of this embodiment may further optionally include a common line CL, a gate line GL and a data line DL (shown in FIG. 1) disposed on the first substrate 20. The gate line GL is electrically connected to a gate electrode G for receiving a driving voltage provided by the gate line GL. The patterned common electrode layer 24 is electrically connected to the common line CL for receiving a common voltage provided by the common line CL. The patterned common electrode layer 24 may include a connection part 24C and a plurality of branch electrode 24B. The branch electrodes 24B are connected to the connection part 24C and substantially arranged in parallel, and a slit 24S exists between any two adjacent branch electrodes 24B. In this embodiment, each branch electrode 24B is a stripe electrode, but the shape of the branch electrode 24B may be modified, and the width of the branch electrode 24B and the width of the slit 24S may be modified. For example, the ratio of the width of the branch electrode 24B to the width of the slit 24S is substantially between 1/3 and 1, but not limited thereto. In addition, the connection part 24C of the patterned common electrode layer 24 may be indirect contact with the common line CL such that the branch electrodes 24B may be electrically connected to the common line CL through the connection part 24C. In a variant embodiment, the patterned common electrode layer 24 may not be in direct contact with the common line CL, and the patterned common electrode layer 24 may be electrically connected to the common line CL in other manner such as through a bridge electrode (not shown). In the vertical projection direction, the semiconductor part 281 of the patterned oxide electrode layer 28 substantially overlaps the branch electrodes 24B, and the conductive part 282 of the patterned oxide electrode layer 28 substantially overlaps the slits 24S.

The active switching device SW may be a thin film transistor (TFT) device, which includes a gate electrode G, a gate insulation layer GI (not shown in FIG. 1), a channel layer CH, a source electrode S and a drain electrode D. The gate insulation layer GI is interposed between the gate electrode G and the channel layer CH, the channel layer CH is substantially corresponding to the gate electrode G, and the source electrode S and the drain electrode D are disposed at two opposite sides of the channel layer CH respectively and partially overlap the channel layer CH. The source electrode S is electrically connected to the data line DL for receiving the pixel voltage provided by the data line DL, and the drain electrode D is electrically connected to the conductive part 282 of the patterned oxide electrode layer 28 to deliver the pixel voltage to the conductive part 282. In this embodiment, the gate insulation layer GI may be a part of the insulation layer 26, i.e. the gate insulation layer GI and the insulation layer 26 are made of the same material layer. In other words, the insulation layer 26 may further cover the gate electrode G to prevent the gate electrode G and the channel layer CH from being directly electrically connected. The material of the channel layer CH may be various types of semiconductor materials such as amorphous silicon, polycrystalline silicon, microcrystalline silicon and nanocrystalline silicon. Alternatively, the material of the channel layer CH may be oxide semiconductor material. In this embodiment, the active switching device SW is an oxide transistor device, and thus the material of the channel layer CH is selected from oxide semiconductor materials. Also, the channel layer CH and the patterned oxide electrode layer 28 may be made of the same material layer. In addition, the channel layer CH and the patterned oxide electrode layer 28 may be structurally connected or disconnected. In other variant embodiments, the channel layer CH and the patterned oxide electrode layer 28 may be made of different material layers and formed by different processes. In this embodiment, a back channel etch (BCE) type TFT device is used as an example. In other variant embodiments, other types of TFT devices such as island stop (IS) type TFT device and coplanar type TFT device may be selected. Furthermore, the active switching device SW may be either bottom gate type TFT structure or top gate type TFT structure. The aforementioned TFT structure is well known in the art, and thus is not redundantly described.

Figure 3:
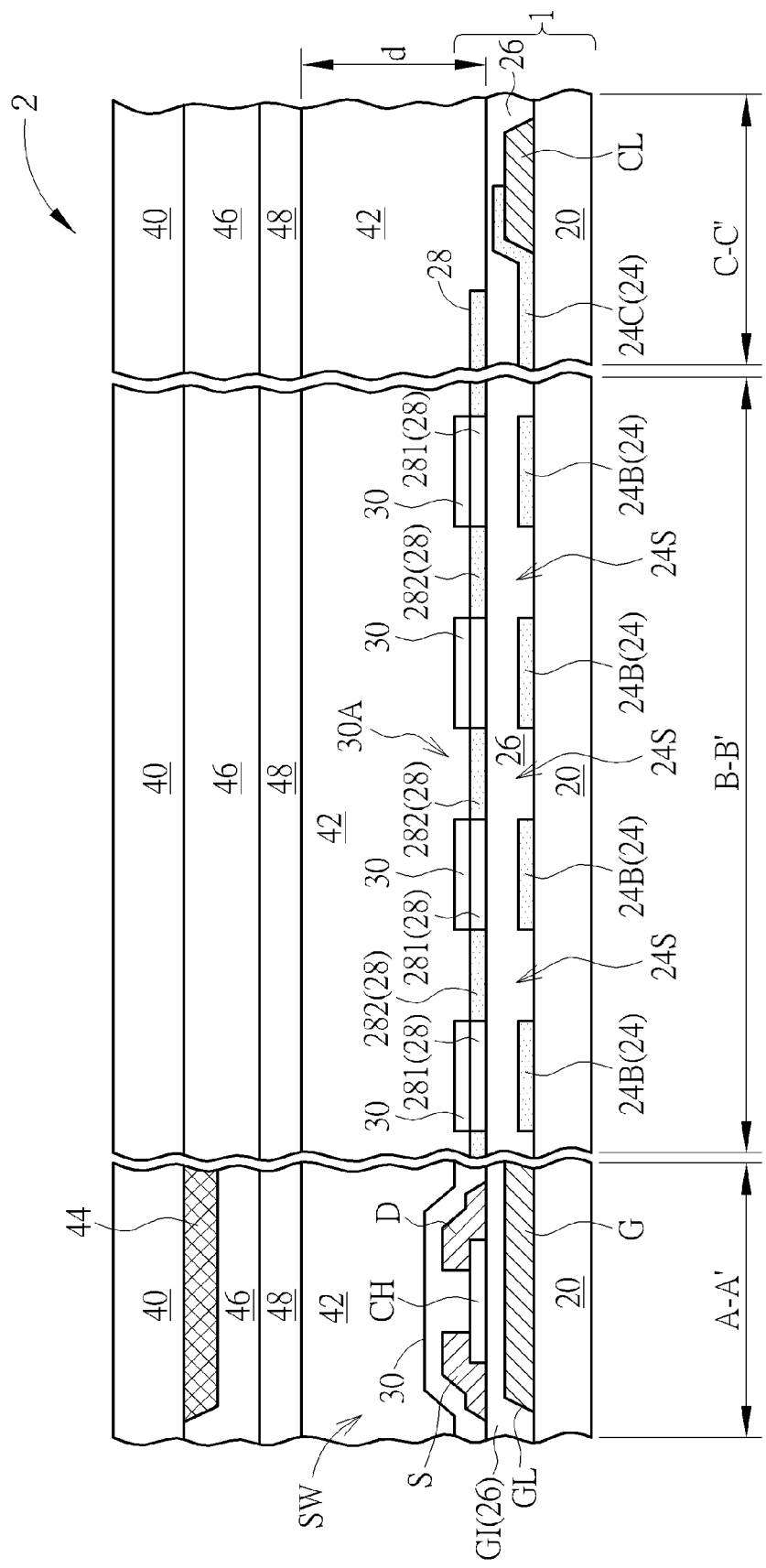
FIG. 3 is a schematic diagram illustrating a display panel according to an embodiment of the present invention.

Referring to FIG. 3, FIG. 3 is a schematic diagram illustrating a display panel according to an embodiment of the present invention. As shown in FIG. 3, the display panel 2 includes a plurality of pixel structures 1, a second substrate 40 and a display medium 42, and only one single pixel structure 1 is drawn. The structure and disposition of the pixel structure 1 are illustrated in FIG. 1 and FIG. 2 and related context. The second substrate 40 faces the first substrate 20. The second substrate 40 may be a transparent substrate, which may be either rigid substrate or flexible substrate. For example, the second substrate 40 may include a glass substrate, a plastic substrate or a quartz substrate, but not limited thereto. The display medium 42 is interposed between the first substrate 20 and the second substrate 40. In this embodiment, an FFS LCD panel is exemplarily selected, and thus the display medium 42 may be liquid crystal molecules, but not limited thereto. The liquid crystal molecules may be twisted nematic (TN) type liquid crystal molecules, or other types of liquid crystal molecules. The liquid crystal molecules may be positive type liquid crystal molecules (dielectric anisotropy is greater than 0, $\Delta\varepsilon>0$) or negative type liquid crystal molecules (dielectric anisotropy is less than 0, $\Delta\varepsilon<0$). In addition, the liquid crystal molecules have a cell gap d and a birefringence ($\Delta n$), and $\Delta n*d$ is substantially preferably between 0.15 and 0.5, but not limited thereto. Other components such as a light-shielding layer 44 (e.g. a black matrix (BM)), a color filter pattern 46 and an overcoat layer 48 may be disposed on the second substrate 40. In other variant embodiments, the display medium 42 may be other types of display media. Also, two alignment films (not shown) may be further disposed between the display medium 42 and the patterned passivation layer 30 and between the display medium 42 and the overcoat layer 48, respectively. The aligning direction of the alignment film and the branch electrode 24B may have an included angle. In addition, the display panel 2 may further include two polarizing sheets (not shown) disposed on the first substrate 20 and the second substrate 40, respectively.

The fabrication and operation method of the pixel structure of the present invention will be illustrated in the following description, and the arrangement and material of the components of the pixel structure are not redundantly described.

Figure 4:
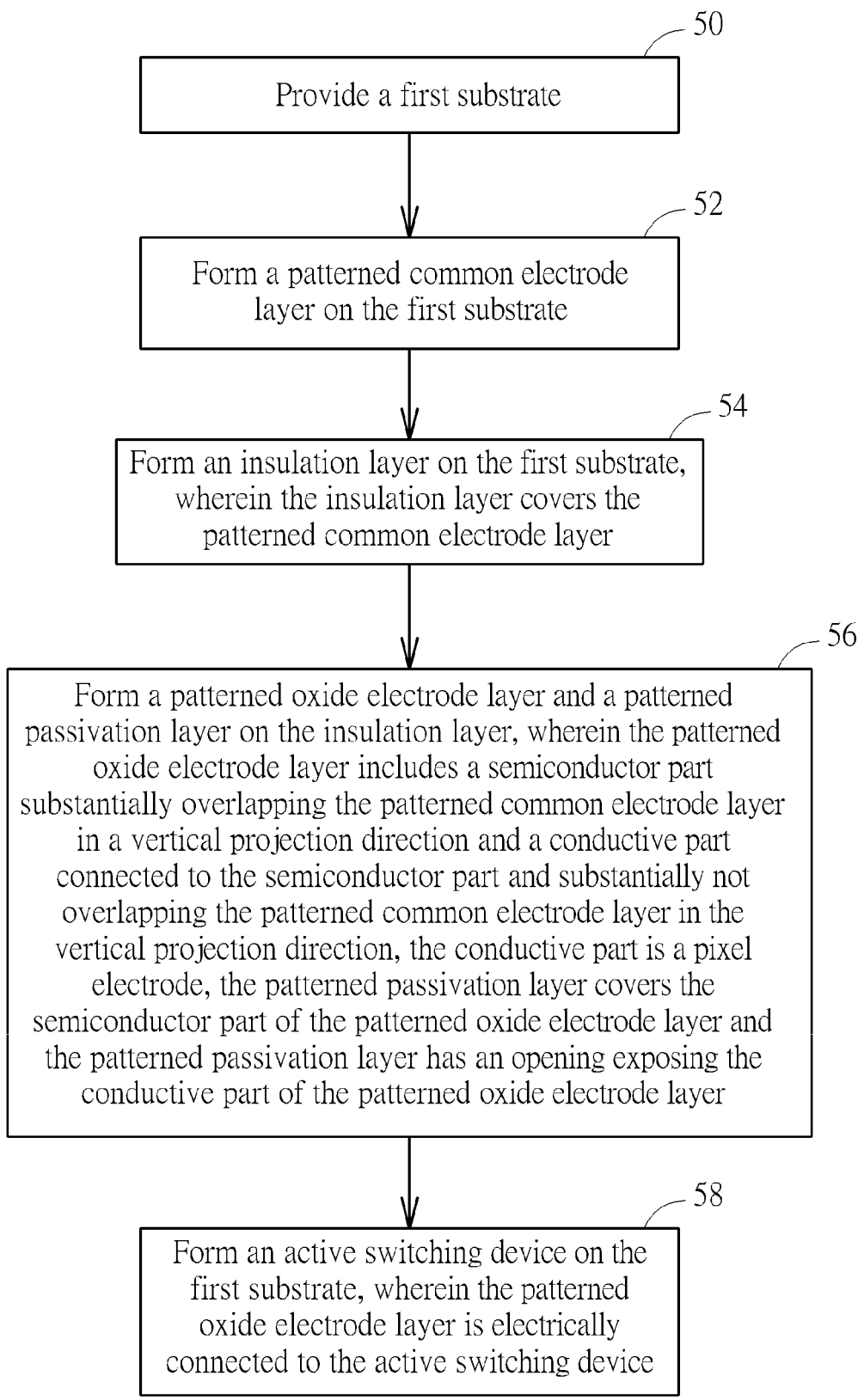
FIG. 4 is a flow chart of the fabrication method of the pixel structure of the present invention.

Referring to FIG. 4, FIG. 4 is a flow chart of the fabrication method of the pixel structure of the present invention. As shown in FIG. 4, the fabrication method of the pixel structure includes the following steps:

Step 50: provide a first substrate;

Step 52: form a patterned common electrode layer on the first substrate;

Step 54: form an insulation layer on the first substrate, wherein the insulation layer covers the patterned common electrode layer;

Step 56: form a patterned oxide electrode layer and a patterned passivation layer on the insulation layer, wherein the patterned oxide electrode layer includes a semiconductor part substantially overlapping the patterned common electrode layer in a vertical projection direction and a conductive part connected to the semiconductor part and substantially not overlapping the patterned common electrode layer in the vertical projection direction, the conductive part is a pixel electrode, the patterned passivation layer covers the semiconductor part of the patterned oxide electrode layer and the patterned passivation layer has an opening exposing the conductive part of the patterned oxide electrode layer; and Step 58: form an active switching device on the first substrate, wherein the patterned oxide electrode layer is electrically connected to the active switching device.

Figure 5:
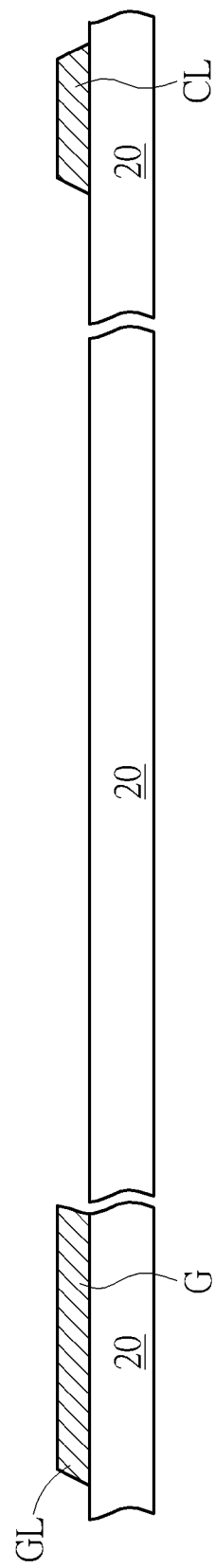
FIGS. 5-9 are schematic diagrams illustrating the fabrication method of the pixel structure according to an embodiment of the present invention.
Figure 6:
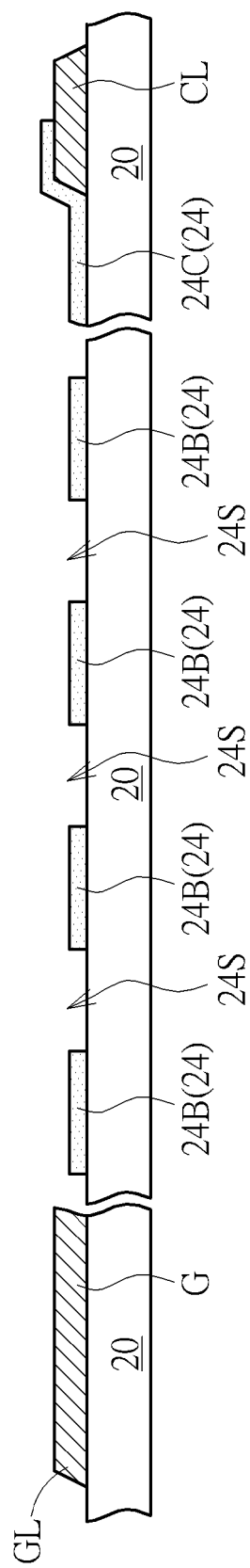

Referring to FIGS. 5-9, FIGS. 5-9 are schematic diagrams illustrating the fabrication method of the pixel structure according to an embodiment of the present invention. As shown in FIG. 5, a first substrate 20 is provided. Then, a first patterned conductive layer is formed on the first substrate 20. The first patterned conductive layer may include a non-transparent conductive layer, and the material may be metal or alloy such as gold (Au), silver (Ag), copper (Cu), aluminum (Al), titanium (Ti), molybdenum (Mo) or alloy thereof. The first patterned conductive layer may also include transparent conductive layer, and the material may be for example indium tin oxide (ITO), indium zinc oxide (IZO) or other proper transparent conductive materials. In addition, the first patterned conductive layer may be single-layered or multi-layered structure, and each layer may be individually selected from non-transparent conductive material or transparent conductive material. The first patterned conductive layer may include a gate electrode G, and optionally include a common line CL and a gate line GL. In other variant embodiments, the gate electrode G, the common line CL and the gate line GL may be made of different conductive layers. As shown in FIG. 6, a patterned common electrode layer 24 is formed on the first substrate 20 as a common electrode. The patterned common electrode layer 24 includes a connection part 24C and a plurality of branch electrodes 24B, wherein the branch electrodes 24B are connected to the connection part 24C and substantially arranged in parallel, and a slit 24S exists between any two adjacent branch electrodes 24B.

Figure 7:
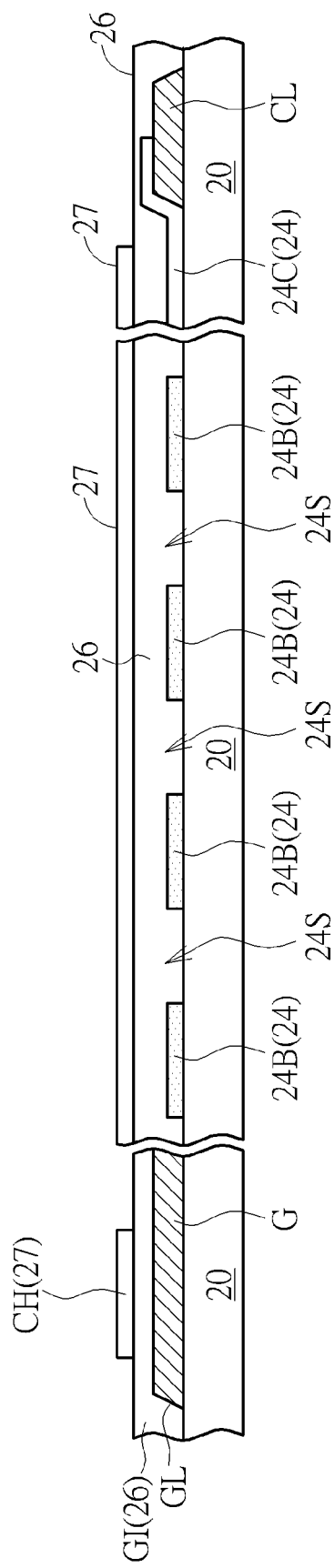

As shown in FIG. 7, an insulation layer 26 and a gate insulation layer GI are formed on the first substrate 20. The insulation layer 26 covers the patterned common electrode layer 24, and may further cover the common line CL as well. The gate insulation layer GI covers the gate electrode G. In this embodiment, the gate insulation layer GI may be part of the insulation layer 26, i.e. the gate insulation layer GI and the insulation layer 26 may be made of the same material layer, but not limited thereto. Subsequently, a patterned oxide layer 27 is formed on the insulation layer 26. The patterned oxide layer 27 may be an oxide semiconductor layer, and the material may include at least one of indium gallium zinc oxide (IGZO), indium tin zinc oxide (ITZO), indium zinc oxide (IZO), zinc tin oxide (ZTO), zinc oxide (ZnO) and aluminum zinc oxide (AZO). The material of the patterned oxide layer 27 may also be other suitable oxide materials. In this embodiment, the material of the channel layer CH may be oxide semiconductor material, and the channel layer CH and the patterned oxide layer 27 may be made of the same material layer, but not limited thereto.

Figure 8:
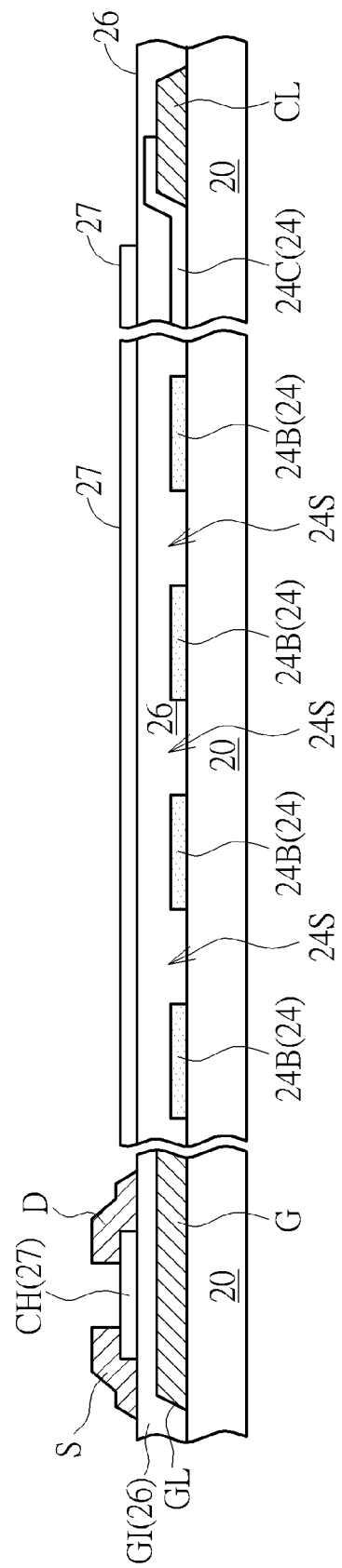

As shown in FIG. 8, a source electrode S and a drain electrode D are formed on the gate insulation layer GI. The source electrode S and the drain electrode D are disposed at two opposite sides of the channel layer CH and partially overlap the channel layer CH, respectively. The source electrode S and the drain electrode D may be made of a second patterned conductive layer. The second patterned conductive layer may include a non-transparent conductive layer, and the material may be metal or alloy such as gold (Au), silver (Ag), copper (Cu), aluminum (Al), titanium (Ti), molybdenum (Mo) or alloy thereof. The second patterned conductive layer may also include transparent conductive layer, and the material may be for example indium tin oxide (ITO), indium zinc oxide (IZO) or other proper transparent conductive materials. In addition, the second patterned conductive layer may be single-layered or multi-layered structure, and each layer may be individually selected from non-transparent conductive material or transparent conductive material. The second patterned conductive layer may further include a data line DL (as shown in FIG. 1) electrically connected to the source electrode S.

Figure 9:
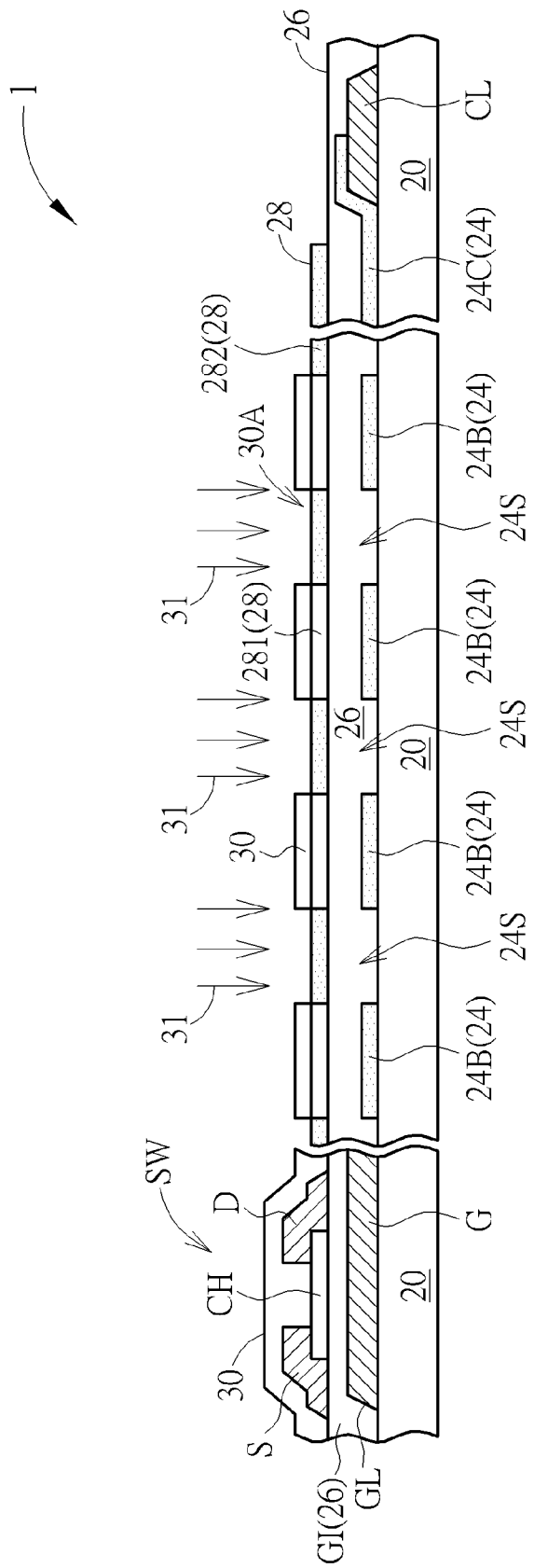

As shown in FIG. 9, a patterned passivation layer 30 is formed on the insulation layer 26. The patterned passivation layer 30 partially covers the patterned oxide layer 27, and the patterned passivation layer 30 has an opening 30A partially exposing the patterned oxide layer 27. Then, the patterned passivation layer 30 is used as a mask to perform a treatment step on the patterned oxide layer 27 to convert the patterned oxide layer 27 into the patterned oxide electrode layer 28. Specifically, the treatment step makes the patterned oxide layer 27 exposed by the opening 30A convert into the conductive part 282 of the patterned oxide electrode layer 28 electrically connected to the drain electrode D, while the patterned oxide layer 27 covered by the patterned passivation layer 30 serves as the semiconductor part 281 of the patterned oxide electrode layer 28. In this embodiment, the treatment step can locally modify the conductivity of the patterned oxide layer 27 by using the patterned passivation layer 30 as a mask. Specifically, before the treatment step, the patterned oxide layer 27 has a first resistance, and after the treatment step, the semiconductor part 281 of the patterned oxide electrode layer 28 covered by the patterned passivation layer 30 still has the first resistance, but the conductive part 282 of the patterned oxide electrode layer 28 exposed by the opening 30A of the patterned passivation layer 30 has the second resistance less than the first resistance. In this embodiment, the patterned oxide layer 27 is an oxide semiconductor layer, and thus the treatment step may be, for example, a gas treatment process or a doping process. Referring to Table 1, Table 1 lists several embodiments of the treatment step of the present invention. As shown in Table 1, when indium gallium zinc oxide (IGZO) is selected as the material of the patterned oxide layer 27, under different types of gas treatment processes with appropriate process parameters e.g. flow rate, power and cycle time, the resistance of IGZO is modified and IGZO becomes conductive.

TABLE 1

| material | Treatment step | Flow rate (sccm) | power (W) | Cycle time (sec) | resistance (Kohm/square) |
| --- | --- | --- | --- | --- | --- |
| IGZO | oxygen($O_2$) treatment | 200 | 1000 | 30 | Out of range |
| | Helium (He) treatment | 100 | 1000 | 30 | ~50 |
| | Argon (Ar) treatment | 250 | 200 | 10 | ~1.4 |
| | Hydrogen ($H_2$) treatment | 1000 | 200 | 10 | ~1.14 |
| | Ammonia ($NH_3$) treatment | 1000 | 200 | 10 | ~2.45 |

The gas used in the gas treatment process is not limited by the gases used in Table 1, but may be other different gases based on conductivity or other requirement. The treatment step is not limited to gad treatment process. The treatment step may be a doping process. For instance, proper dopants such as indium (In) or gallium (Ga) may doped in the patterned oxide layer 27 to increase the conductivity of the conductive part 282 of the patterned oxide electrode layer 28. The dopants of the doping process are not limited by the aforementioned dopants, and may be any suitable dopants.

Figure 10:
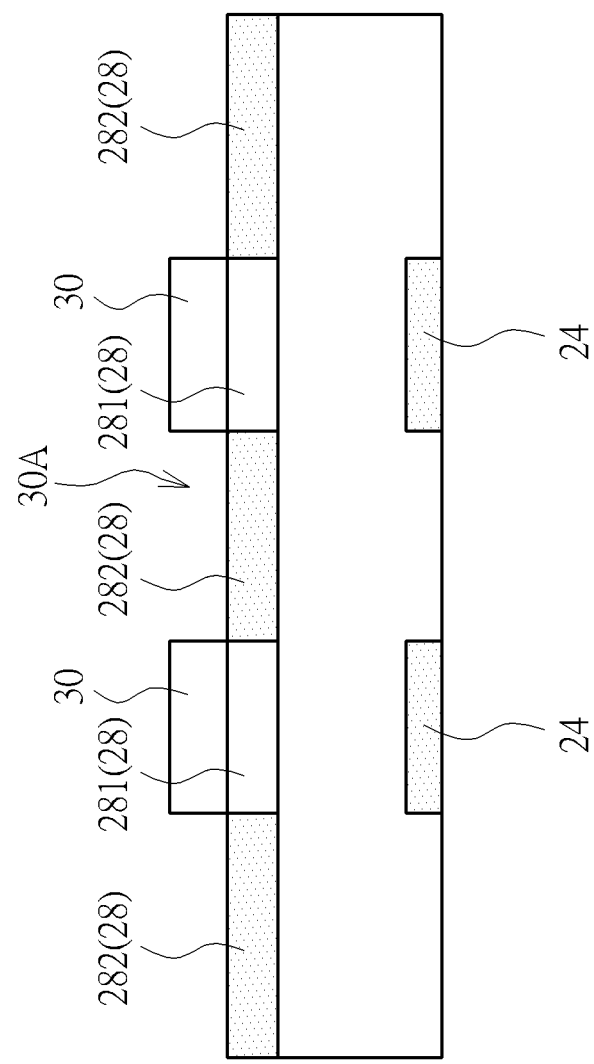
FIG. 10 is a schematic diagram illustrating the patterned common electrode layer and the patterned oxide electrode layer of the pixel structure of the present invention.
Figure 11:
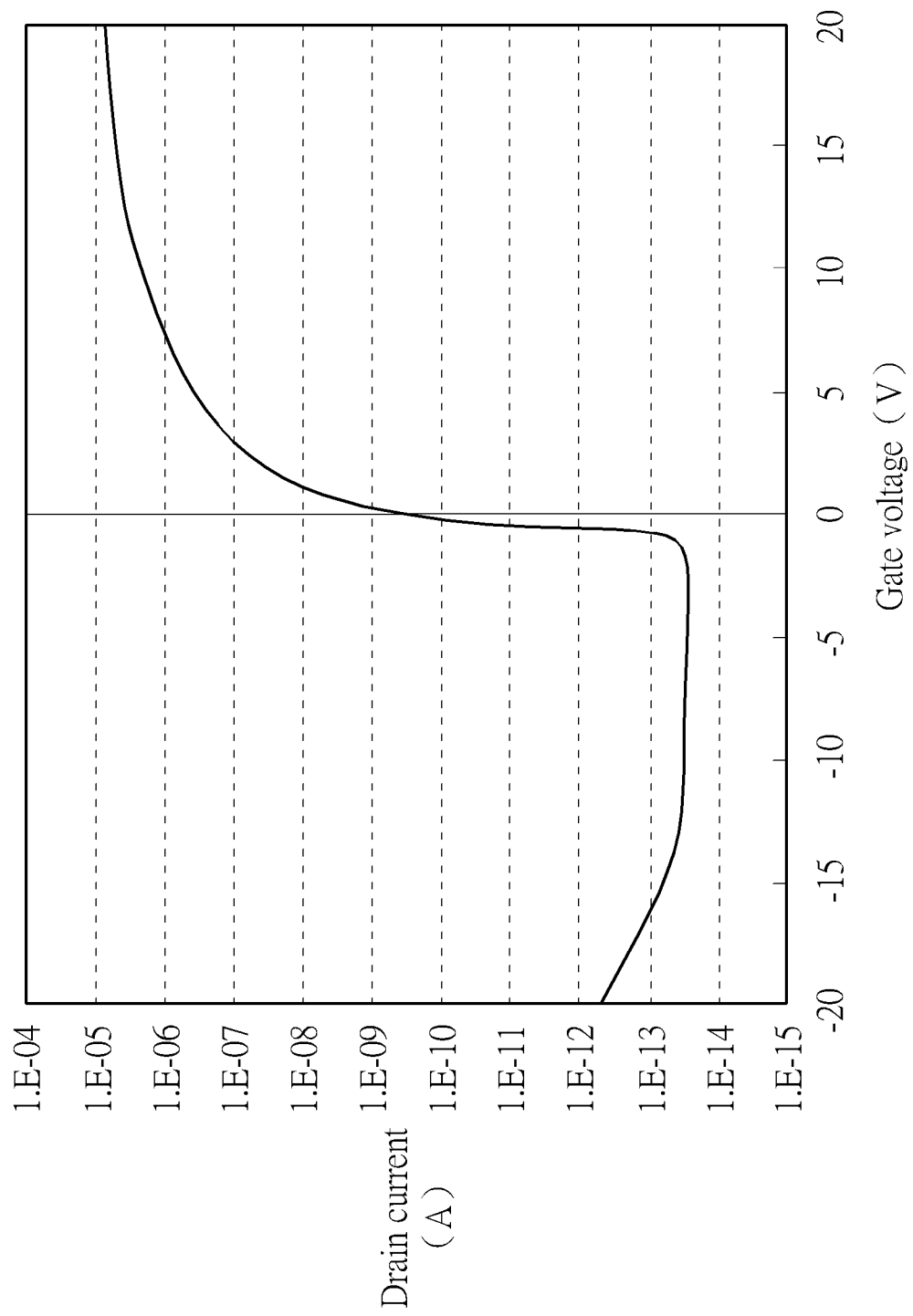
FIG. 11 illustrates drain current-gate voltage relation of the oxide transistor device.

Referring to FIG. 10 and FIG. 11 as well as FIGS. 1-3, FIG. 10 is a schematic diagram illustrating the patterned common electrode layer and the patterned oxide electrode layer of the pixel structure of the present invention, and FIG. 11 illustrates drain current-gate voltage relation of the oxide transistor device. As shown in FIG. 10, the insulation layer 26 is interposed between the patterned common electrode layer 24 and the patterned oxide electrode layer 28, the semiconductor part 281 of the patterned oxide electrode layer 28 is substantially corresponding to the patterned common electrode layer 24, and the conductive part 282 of the patterned oxide electrode layer 28 is disposed aside the semiconductor part 281. Consequently, the above structure is similar to an oxide transistor device, where the common voltage of the patterned common electrode layer 24 can be regarded as gate voltage, while the conducted current of the semiconductor part 281 of the patterned oxide electrode layer 28 can be regarded as drain current. The characteristic of the above oxide transistor device is illustrated in FIG. 11. When the gate voltage is smaller than a predetermined value, e.g. when the gate voltage is negative, the oxide transistor device is in turn-off state. By virtue of the aforementioned characteristic, the common voltage of the patterned common electrode layer 24 may be a negative voltage. The negative common voltage creates a negatively-biased electric field to the semiconductor part 281 of the patterned oxide electrode layer 28, and thus the semiconductor part 281 is converted into a non-conductive part under the negatively-biased electric field, which diminishes the conducted current as shown in left part of FIG. 11. Therefore, even though the semiconductor part 281 and the conductive part 282 of the patterned oxide electrode layer 28 are structurally connected, the semiconductor part 281 is converted into non-conductive part under the negatively-biased electric field. In such a case, the pixel voltage is only delivered to the conductive part 282, and fringe field effect due to the voltage difference between the pixel voltage of the conductive part 282 and the common voltage of the patterned common electrode layer 24 is generated to implement display effect. In addition, the patterned oxide electrode layer 28 substantially covers the connection part 24C, the branch electrodes 24B and the slits 24S of the patterned common electrode layer 24. The common voltage of the connection part 24C and the branch electrodes 24B is able to convert the semiconductor part 281 into non-conductive part under negatively-biased electric field, while the conductive part 282 serves as the pixel electrode. Accordingly, the conductive part (pixel electrode) 282 and the branch electrode (common electrode) 24B of the patterned common electrode layer 24 can be self-aligned, which improves aperture ratio.

Figure 12:
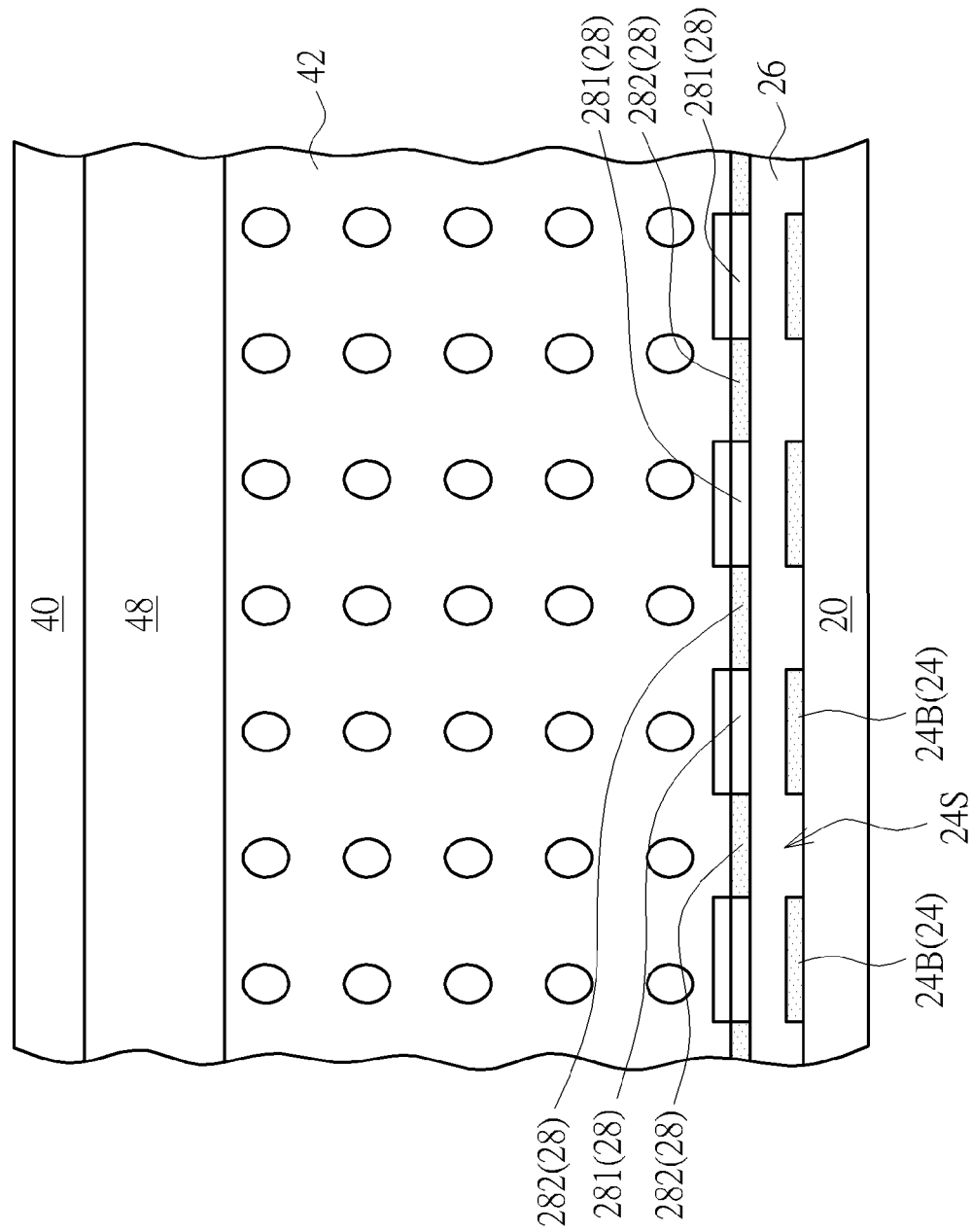
FIG. 12 is a schematic diagram illustrating a display panel of an embodiment in dark display mode.
Figure 13:
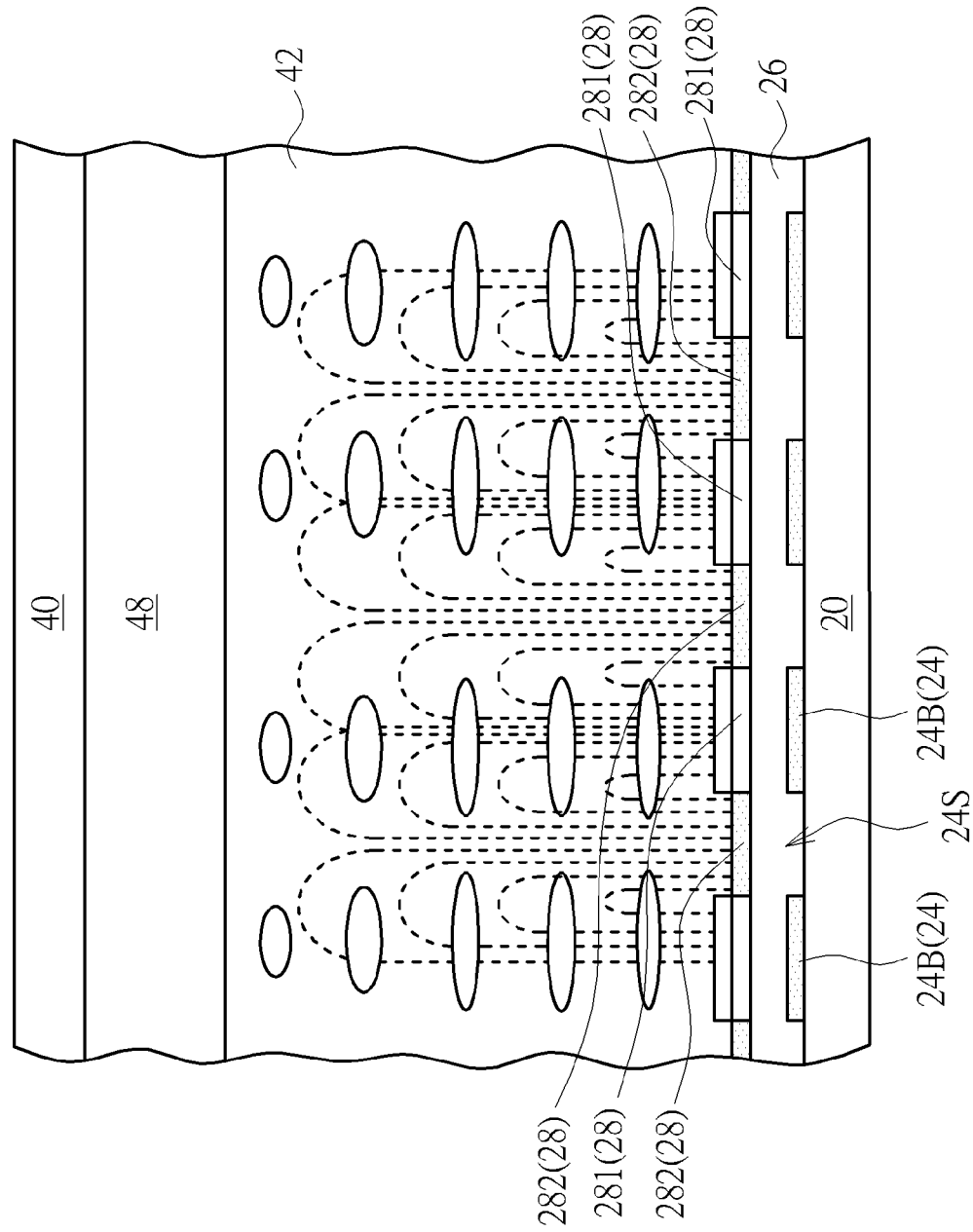
FIG. 13 is a schematic diagram illustrating a display panel of an embodiment in bright display mode.

Referring to FIG. 12 and FIG. 13, FIG. 12 is a schematic diagram illustrating a display panel of an embodiment in dark display mode, and FIG. 13 is a schematic diagram illustrating a display panel of an embodiment in bright display mode. As shown in FIG. 12, in dark display mode, the common voltage of the patterned common electrode layer 24 is negative e.g. −2V, while the pixel voltage of the conductive part 282 of the patterned oxide electrode layer 28 is substantially identical to the common voltage. As shown in FIG. 13, in bright display mode, the common voltage of the patterned common electrode layer 24 is negative e.g. −2V, while the pixel voltage of the conductive part 282 of the patterned oxide electrode layer 28 is modified based on desired gray value, and different from the common voltage. Accordingly, fringe field effect is generated to drive the display medium 42.

Figure 14:
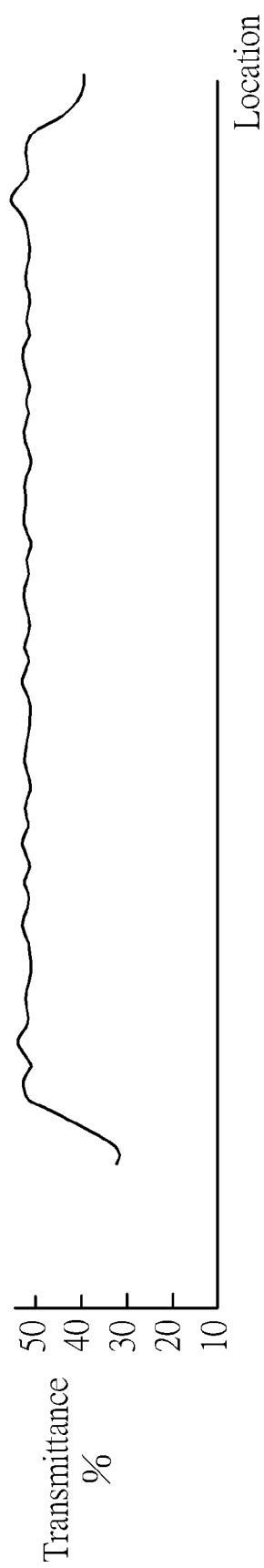
FIG. 14 is a simulation result of transmittance of the pixel structure of an embodiment of the present invention.
Figure 15:
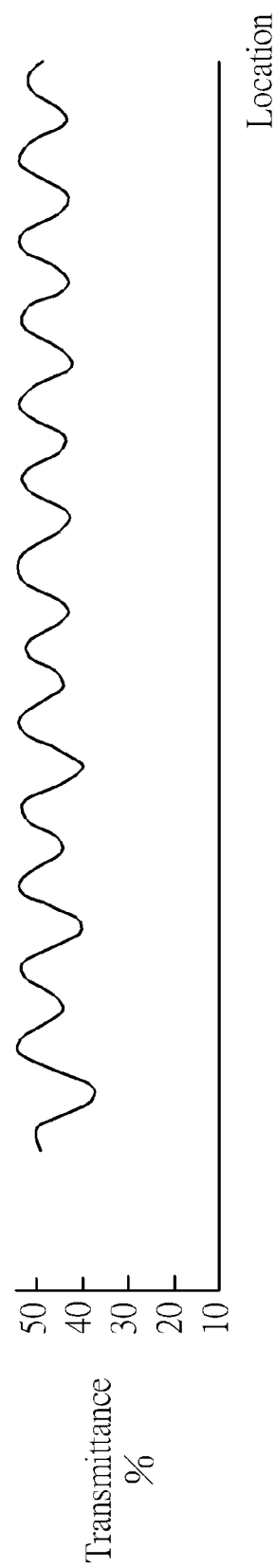
FIG. 15 is a simulation result of transmittance of the pixel structure of a comparative embodiment.

Referring to FIG. 14 and FIG. 15, FIG. 14 is a simulation result of transmittance of the pixel structure of an embodiment of the present invention, and FIG. 15 is a simulation result of transmittance of the pixel structure of a comparative embodiment. As shown in FIG. 13 and FIG. 14, in this embodiment, the patterned common electrode layer 24 and the conductive part (pixel electrode) 282 are disposed at different locations (the patterned common electrode layer 24 does not substantially overlap the conductive part 282 in the vertical projection direction). Consequently, the transmittance distribution of the pixel structure of this embodiment is evidently more identical, and the average transmittance is approximately 40.26%. As shown in FIG. 15, when the patterned common electrode layer 24 is replaced with a planar common electrode layer without patterning, the transmittance distribution of the pixel structure of the comparative embodiment is less identical, and the average transmittance is reduced to approximately 38.13%. Thus, it is proven that the pixel structure of the present invention can display uniformly brighter images.

In conclusion, the pixel structure and display panel of the present invention use the conductive part of the patterned oxide electrode layer as pixel electrode, which can effectively increase the transmittance and brightness uniformity of the displayed images. In addition, the patterned oxide electrode layer may be made by the same material layer as the channel layer of the active switching device, and thus the process steps and fabrication cost can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure, disposed on a first substrate, the pixel structure comprising:
   an active switching device, disposed on the first substrate;
   a patterned common electrode layer, disposed on the first substrate;
   an insulation layer, disposed on the first substrate and covering the patterned common electrode layer;
   a patterned oxide electrode layer, disposed on the insulation layer and electrically connected to the active switching device, the patterned oxide electrode layer comprising:
      a semiconductor part, substantially overlapping the patterned common electrode layer in a vertical projection direction; and
      a conductive part, connected to the semiconductor part and substantially not overlapping the patterned common electrode layer in the vertical projection direction, and the conductive part being a pixel electrode; and
   a patterned passivation layer, disposed on the patterned oxide electrode layer and covering the semiconductor part of the patterned oxide electrode layer, wherein the patterned passivation layer has an opening exposing the conductive part of the patterned oxide electrode layer.

2. The pixel structure of claim 1, further comprising a common line disposed on the first substrate, wherein the patterned common electrode layer is electrically connected to the common line.

3. The pixel structure of claim 1, wherein the patterned common electrode layer comprises a connection part and a plurality of branch electrodes, the branch electrodes are connected to the connection part, the branch electrodes are substantially arranged in parallel, and a slit is disposed between any two adjacent branch electrodes.

4. The pixel structure of claim 3, wherein the semiconductor part of the patterned oxide electrode layer substantially overlaps the branch electrodes and the conductive part of the patterned oxide electrode layer substantially overlaps the slits in the vertical projection direction.

5. The pixel structure of claim 1, wherein a material of the patterned common electrode layer comprises a transparent conductive material.

6. The pixel structure of claim 1, wherein a material of the patterned oxide electrode layer comprises at least one of indium gallium zinc oxide (IGZO), indium tin zinc oxide (ITZO), indium zinc oxide (IZO), zinc tin oxide (ZTO), zinc oxide (ZnO) and aluminum zinc oxide (AZO).

7. The pixel structure of claim 1, wherein the semiconductor part has a first resistance, the conductive part has a second resistance and the first resistance is higher than the second resistance.

8. The pixel structure of claim 1, wherein the patterned common electrode layer has a common voltage, the common voltage creates a negatively-biased electric field for the semiconductor part and the semiconductor part is converted into a non-conductive part under the negatively-biased electric field.

9. The pixel structure of claim 1, wherein the active switching device comprises an oxide transistor device having a channel layer, and the patterned oxide electrode layer and the channel layer are made of the same material layer.

10. The pixel structure of claim 9, wherein the oxide transistor device has a gate electrode, a gate insulation layer, a source electrode and a drain electrode, the gate insulation layer is disposed between the gate electrode and the channel layer, the channel layer is substantially corresponding to the gate electrode, and the source electrode and the drain electrode are disposed at two opposite sides of the channel layer respectively, and partially overlap the channel layer respectively.

11. A display panel, comprising:
    a first substrate;

an active switching device, disposed on the first substrate;
a patterned common electrode layer, disposed on the first substrate;
an insulation layer, disposed on the first substrate and covering the patterned common electrode layer;
a patterned oxide electrode layer, disposed on the insulation layer and electrically connected to the active switching device, the patterned oxide electrode layer comprising:
  a semiconductor part, substantially overlapping the patterned common electrode layer in a vertical projection direction; and
  a conductive part, connected to the semiconductor part and substantially not overlapping the patterned common electrode layer in the vertical projection direction, and the conductive part being a pixel electrode;
a patterned passivation layer, disposed on the patterned oxide electrode layer and covering the semiconductor part of the patterned oxide electrode layer, wherein the patterned passivation layer has an opening exposing the conductive part of the patterned oxide electrode layer;
a second substrate, facing the first substrate; and
a display medium, interposed between the first substrate and the second substrate.

12. A method of fabricating pixel structure, comprising:
providing a first substrate;
forming a patterned common electrode layer on the first substrate;
forming an insulation layer on the first substrate, wherein the insulation layer covers the patterned common electrode layer;
forming a patterned oxide electrode layer and a patterned passivation layer on the insulation layer, wherein the patterned oxide electrode layer comprises a semiconductor part substantially overlapping the patterned common electrode layer in a vertical projection direction and a conductive part connected to the semiconductor part and substantially not overlapping the patterned common electrode layer in the vertical projection direction, the conductive part is a pixel electrode, the patterned passivation layer covers the semiconductor part of the patterned oxide electrode layer and the patterned passivation layer has an opening exposing the conductive part of the patterned oxide electrode layer; and
forming an active switching device on the first substrate, wherein the patterned oxide electrode layer is electrically connected to the active switching device.

13. The method of fabricating pixel structure of claim 12, wherein the patterned common electrode layer comprises a connection part and a plurality of branch electrodes, the branch electrodes are connected to the connection part, the branch electrodes are substantially arranged in parallel, and a slit is disposed between any two adjacent branch electrodes.

14. The method of fabricating pixel structure of claim 13, wherein in the vertical projection direction the semiconductor part of the patterned oxide electrode layer substantially overlaps the branch electrodes and the conductive part of the patterned oxide electrode layer substantially overlaps the slits.

15. The method of fabricating pixel structure of claim 12, wherein a material of the patterned oxide electrode layer comprises at least one of indium gallium zinc oxide (IGZO), indium tin zinc oxide (ITZO), indium zinc oxide (IZO), zinc tin oxide (ZTO), zinc oxide (ZnO) and aluminum zinc oxide (AZO).

16. The method of fabricating pixel structure of claim 12, wherein the semiconductor part has a first resistance, the conductive part has a second resistance and the first resistance is higher than the second resistance.

17. The method of fabricating pixel structure of claim 12, wherein the patterned common electrode layer has a common voltage, the common voltage creates a negatively-biased electric field for the semiconductor part and the semiconductor part is converted into a non-conductive part under the negatively-biased electric field.

18. The method of fabricating pixel structure of claim 12, wherein steps of forming the patterned oxide electrode layer and the patterned passivation layer on the insulation layer comprise:
  forming a patterned oxide layer on the insulation layer, wherein the patterned oxide layer is an oxide semiconductor layer;
  forming the patterned passivation layer having the opening on the patterned oxide layer; and
  using the patterned passivation layer as a mask to perform a treatment step on the patterned oxide layer to convert the patterned oxide layer exposed by the opening into the conductive part, wherein the patterned oxide layer covered by the patterned passivation layer serves as the semiconductor part.

19. The method of fabricating pixel structure of claim 12, wherein steps of forming the active switching device comprise:
  forming a gate electrode on the first substrate;
  forming a gate insulation layer on the first substrate, wherein the gate insulation layer covers the gate electrode;
  forming a channel layer on the gate insulation layer substantially corresponding to the gate electrode; and
  forming a source electrode and a drain electrode on the gate insulation layer, wherein the source electrode and the drain electrode are disposed at two opposite sides of the channel layer respectively and partially overlap the channel layer respectively, and the drain electrode is electrically connected to the conductive part of the patterned oxide electrode layer.

20. The method of fabricating pixel structure of claim 19, wherein the channel layer and the patterned oxide electrode layer are made of the same material layer.

* * * * *